(12) United States Patent
Cheon et al.

(10) Patent No.: US 10,164,373 B1
(45) Date of Patent: Dec. 25, 2018

(54) AUTOMATIC ENGAGEMENT SYSTEM FOR LIQUID OR POWER CONNECTIONS

(71) Applicant: Koolance, Inc., Auburn, WA (US)

(72) Inventors: Kioan Cheon, Federal Way, WA (US); AnKuk Song, AnYang-Shi (KR)

(73) Assignee: Koolance, Inc., Auburn, WA (US)

( * ) Notice: Subject to any disclaimer, the term of this patent is extended or adjusted under 35 U.S.C. 154(b) by 189 days.

(21) Appl. No.: 14/210,282

(22) Filed: Mar. 13, 2014

Related U.S. Application Data

(60) Provisional application No. 61/788,541, filed on Mar. 15, 2013.

(51) Int. Cl.
| | |
|---|---|
| *F16L 39/02* | (2006.01) |
| *F16L 39/00* | (2006.01) |
| *F16L 37/00* | (2006.01) |
| *F16L 37/62* | (2006.01) |
| *H01R 13/622* | (2006.01) |
| *H01R 13/629* | (2006.01) |
| *H01R 43/26* | (2006.01) |

(52) U.S. Cl.
CPC ......... *H01R 13/622* (2013.01); *H01R 13/629* (2013.01); *H01R 43/26* (2013.01)

(58) Field of Classification Search
CPC ......... F16L 37/002; F16L 37/62; F16L 39/00; F16L 39/02; H01R 13/622; H01R 13/629; H01R 43/26
USPC .................................. 285/124.1–124.5, 920
See application file for complete search history.

(56) References Cited

U.S. PATENT DOCUMENTS

| | | | | |
|---|---|---|---|---|
| 2,475,468 A * | 7/1949 | Andrews | .................... | H01J 7/24 285/123.3 |
| 3,831,951 A * | 8/1974 | Patel | ..................... | F16J 15/062 277/641 |
| 4,611,831 A * | 9/1986 | Truchet | .................... | F16L 37/56 285/26 |
| 5,024,467 A * | 6/1991 | Truchet | ................. | F16L 37/002 285/18 |
| 5,198,240 A * | 3/1993 | Baxi | ................... | B29C 45/1732 264/523 |
| 5,676,560 A * | 10/1997 | Endo | .................... | B60L 11/1818 439/310 |
| 6,382,678 B1 * | 5/2002 | Field | ....................... | F16L 39/00 116/200 |
| 6,481,756 B1 * | 11/2002 | Field | ..................... | F16L 29/005 285/120.1 |
| 6,595,552 B1 * | 7/2003 | Mortari | .................... | F16L 39/00 285/18 |
| 8,336,922 B2 * | 12/2012 | Tiberghien | .............. | F16L 37/56 137/594 |

(Continued)

FOREIGN PATENT DOCUMENTS

DE 4444568 A1 * 6/1996 ............. G02B 6/426

*Primary Examiner* — Phi D A
*Assistant Examiner* — Omar F Hijaz
(74) *Attorney, Agent, or Firm* — DWC Law Firm, P.S.; David Chen

(57) ABSTRACT

Methods, apparatus and systems are disclosed for automatically engaging and disengaging connectors for equipment modules. The connectors can be engaged by operating a rotating shaft to draw opposite connector sections together. A guide pin and socket are provided to guide the alignment of connectors and shaft and to trigger operation of the rotating shaft.

3 Claims, 7 Drawing Sheets

(56) References Cited

U.S. PATENT DOCUMENTS

| | | | |
|---|---|---|---|
| 8,499,839 B2* | 8/2013 | Reid | E21B 41/04 |
| | | | 166/338 |
| 2007/0114790 A1* | 5/2007 | Burmeister | F16L 39/00 |
| | | | 285/124.1 |

* cited by examiner

AUTOMATIC ENGAGEMENT SYSTEM FOR LIQUID OR POWER CONNECTIONS

CROSS REFERENCE TO RELATED APPLICATION(S)

This application claims the benefit of U.S. provisional patent application Ser. No. 61/788,541 (filed Mar. 15, 2013) which is incorporated herein by reference in its entirety.

BACKGROUND

1. Field of the Disclosure

The present disclosure relates to automatic engagement systems that can serve to blind mate quick disconnect couplings (and/or any required electrical plugs) between a chassis and a rear manifold (e.g., for use in liquid cooling) or back plane, for equipment modules, such as, for example, servers and server racks.

BRIEF SUMMARY

In some embodiments, an automatic engagement system is provided comprising a male section having a motor and connector shaft and a female section having a receiving port for receiving the connector shaft. The receiving port can have one or more mating members for engaging a surface of the connector shaft, such that when the connector shaft rotates, the connector shaft is drawn into the receiving port, or drawn out of the receiving port, relative to the direction of rotation.

One or more first connector sections can be coupled to the male section and one or more second connector sections can be coupled to the female section, the connector sections being alignable. The connector sections can be electrical connector sections of fluid coupling sections.

A guide pin can be attached to either the female section or male section. A socket for receiving the guide pin can be positioned on the other section opposite the section on which the guide pin is attached.

In some embodiments, when the guide pin is inserted into the socket, the motor is triggered for rotating the connector shaft and drawing the male section and female section together.

Methods and apparatus are also disclosed herein for making and using various aspects of the disclosure.

DETAILED DESCRIPTION

In the following description, certain specific details are set forth in order to provide a thorough understanding of various embodiments of the disclosure. However, upon reviewing this disclosure, one skilled in the art will understand that the disclosure may be practiced without many of these details. In other instances, well-known structures related to hydraulic equipment, couplings, electrical connections, electrical switches, computer equipment, severs, server racks and server cabinets, have not been described in detail to avoid unnecessarily obscuring the descriptions of the embodiments of the disclosure.

In the present description, the terms "about" or "consisting essentially of," and their equivalents, mean±20% of the indicated range, value, or structure, unless otherwise indicated. It should be understood that the terms "a" and "an" as used herein refer to "one or more" of the enumerated components. The use of the alternative (e.g., "or") should be understood to mean either one, both, or any combination thereof of the alternatives. As used herein, the terms "include" and "comprise" are used synonymously, which terms and variants thereof are intended to be construed as non-limiting.

Various embodiments of the present disclosure are described in the context of application to rack mounted servers employing liquid cooling. However, as will be appreciated by those skilled in the art, the disclosed embodiments can be applicable in other context, such as, for example, other equipment modules that require multiple connections in blind mating configurations. In various context described herein, the term fluid may be exchanged with liquid, as will be appreciated by those skilled in the art after reviewing this disclosure, and the liquid may be gas or other fluid.

Figure 1:
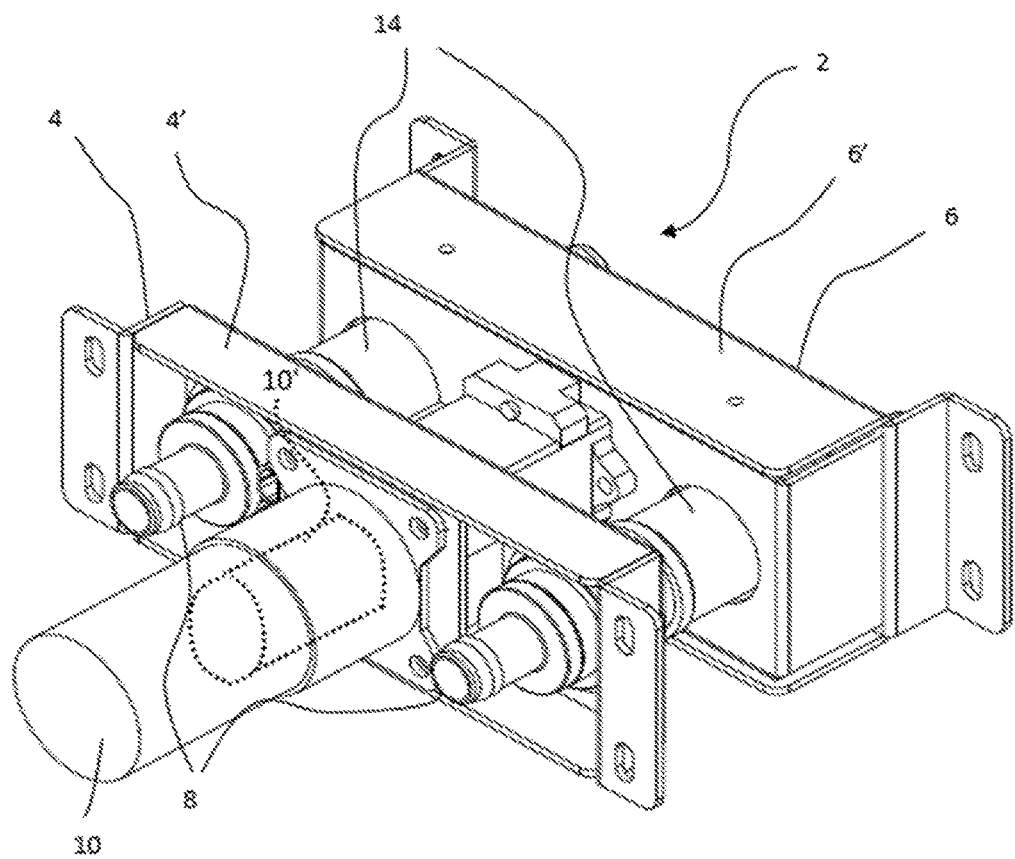
FIG. 1 is a perspective view of an embodiment of an automatic engagement system of the present disclosure, with the male section and female section engaged.
Figure 2:
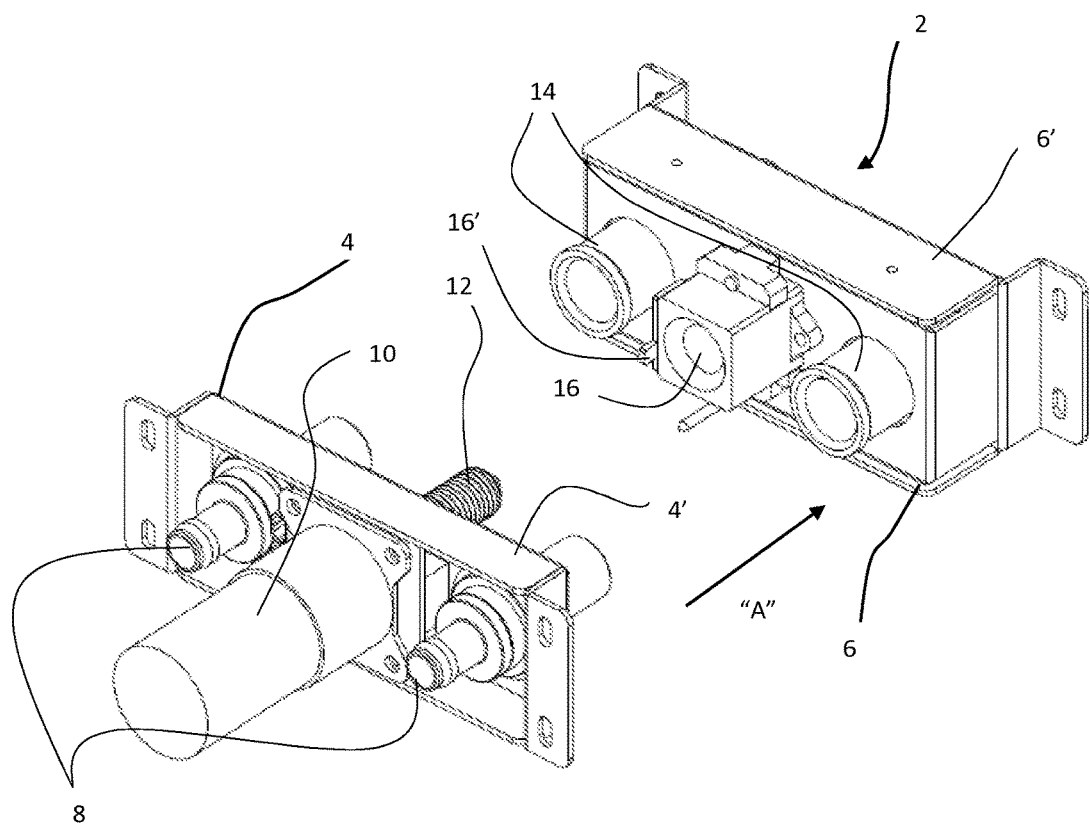
FIG. 2 is a perspective view of the automatic engagement system of FIG. 1, with the male section and female section disengaged.

In some embodiments of the present disclosure, an automatic engagement system 2 (or engager) is provided, such as shown in FIGS. 1 and 2. The engager 2 can have a male section 4 and a female section 6. The male section 4 can comprise a body portion 4' to which one or more first connector sections 8 can be attached, such as, for example, fluid conduit coupling sections (e.g., male member or female member of couplings). The male section 4 can also comprise a case 10, coupled to the body portion 4' of the male section 4. A motor 10' can be contained within the case. Also, a connector shaft 12 can be can axially centered within a portion of the case, and can be attached to the motor and extend outward from the case. The connector shaft can have a threaded surface, or external thread, so that rotation of the connector shaft 12 driven by the motor, causes the connector shaft 12 to draw outward or inward with respect a mating surface having complimentary threads, or internal threads (as discussed further below).

In some embodiments, the female section 6 can comprise a female body portion 6', to which one or more second connector sections 14, can be attached. The second connector sections 14 can be configured to mate with the corresponding first connector sections (e.g., if the first connector sections are male, the corresponding second connector sections can be female, and vice versa). The female section 6 can also comprise a receiving port 16, for receiving the connector shaft 12. In some embodiments, the connector shaft 12 is cylindrical in shape, and the receiving port 16 can have a passageway, with internally threaded sidewalls, or otherwise, one or more threaded mating members that mate with the external threads on the connector shaft 12, so that when the connector shaft 12 is inserted in the receiving port 16, and rotates, the connector shaft 12 can be drawn over the threaded mating members to pull the connector shaft inward into the receiving port 16, thereby, drawing the male section 4 and female section 6 together, such as, for example, from the positions shown in FIG. 2, to the positions shown in FIG. 1.

The one or more second connector sections 14 can be disposed on the female body portion 6' in a manner such that the first connector sections 8 on the male body portion 4' can align and mate with the corresponding second connector sections 14, when the male section 4 and female section 6, are aligned, and pulled together by the connector shaft 12.

Figure 3:
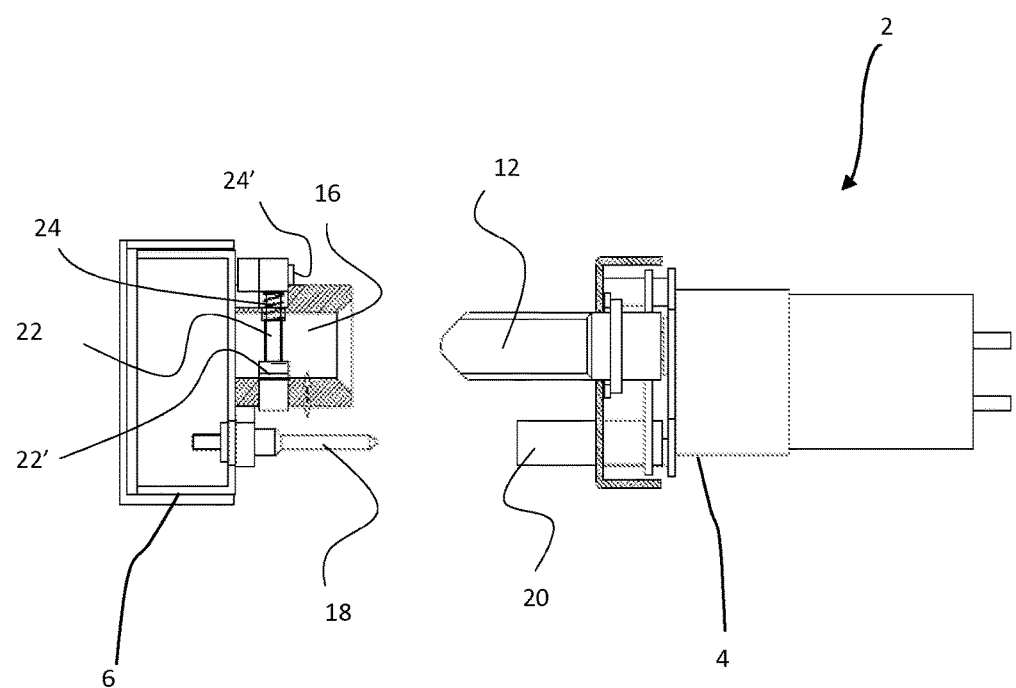
FIG. 3 is partial cross sectional side elevation view of the automatic engagement system of FIG. 1.
Figure 5:
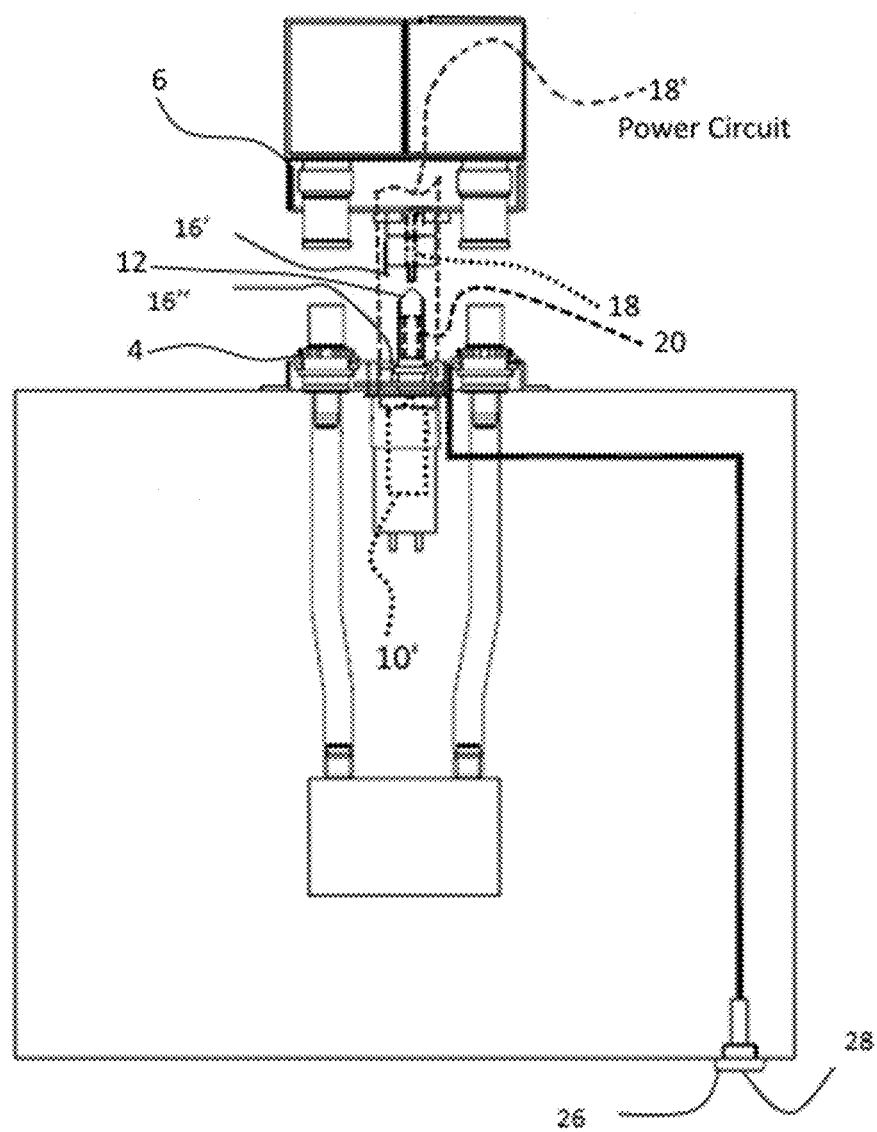
FIG. 5 is a simplified overhead plan view of the automatic engagement system of FIG. 1, showing the male section mounted in a chassis, having a disengagement activation button.

Referring to FIGS. 3 & 5, in some embodiments, a guide pin 18 is provided on one of the sections, such as, for example, on the female section 6. A corresponding socket 20 can be provided on the opposite section (e.g., the male section 4). In some embodiments, when the guide pin 18 is inserted in the socket a power circuit 18' can be completed to supply power to the motor, and automatically activate the motor for the connector shaft 12. The guide pin 18 can be an elongated metallic cylinder, and the socket 20 can comprise a metallic contact(s) within a circular passageway sized to receive that the guide pin 18 snugly within the socket. An axis of the guide pin 18 and an axis of the internal passageway of the socket 20 can each be aligned in parallel with an axis of the connector shaft 12, such that when the guide pin 18 is inserted within the socket 20, and the female section 6 and male section 4 are aligned upright in the same plane, then the connector shaft 12 also aligns with the receiving port 16. Thus, in such alignment, when the guide pin 18 is inserted into the socket, the motor can actuate, and if a user manually pushes the sections together, the rotating connector shaft 12 can contact a threaded mating member of the receiving port 16 and draw the sections 4, 6 together, in a manner that connects the first connectors sections 8 to the second connectors sections 14, as will be appreciated by those skilled in the after reviewing this disclosure. The rotation of the connector shaft 12 can be stopped in a variety of manners, such as, for example, by microcontroller or mechanical switch, as will be appreciated by those skilled in the art after reviewing this disclosure. For example, in some embodiments, a movable spring loaded stub 16' can be biased outward from the female section, and when the rotating connector shaft 12 rotates to draw the male section and female section together, the stub 16' can be depressed to cut off a power circuit 18' to the motor for driving the connector shaft. In other embodiments, the stub 16' is stationary and can interact with a spring biased contact surface 16" (See, e.g., FIG. 5) on the male section, to depress that spring biased contact surface, which in turn, can deactivate the power circuit 18' to the motor, and stop the connector shaft from rotating.

Referring to FIG. 5, in some embodiments, an actuator button 26 can serve as a second switch member, to complete an alternate power circuit to the motor, which drives the motor to operate the connector shaft 12 in an opposite rotating direction, in comparison to its direction of rotation during connection. In particular, a user can depress the actuator button 26 to cause the connector shaft 12 to rotate in a reverse direction, and thereby, withdraw from the receiving port 16, and in turn, disconnect the first connector section(s) from the second connector section(s). In some embodiments, the motor 10' can stop when a circuit for the guide pin is clear from the socket, or the motor can stop based on instructions on a microcontroller for a particular number of rotations.

In some embodiments, the actuator button 26 can include a light 28 (e.g., LED light), connected to a power source, such as, for example, a microcontroller, that switches the light to illuminate when the connector shaft 12 is connected and fully rotated inward in the receiving port, and to turn off when the connector shaft 12 is full disconnected from the receiving port. In this context, "fully rotated" can refer to a position of the connector shaft 12 if it is controlled by a microcontroller that is calibrated ahead of time, extended sufficiently to ensure that the connector section(s) are fully connected, or alternatively, it can refer to a position of the connector shaft extended to the point where the electromechanical switch 16', 16" is actuated to deactivate the motor, as will be appreciated by those skilled in the art after reviewing this disclosure (wherein the positions of the switch parts are disposed to ensure that the connector sections are fully mated before the switch is activated to deactivate the motor).

Figure 4:
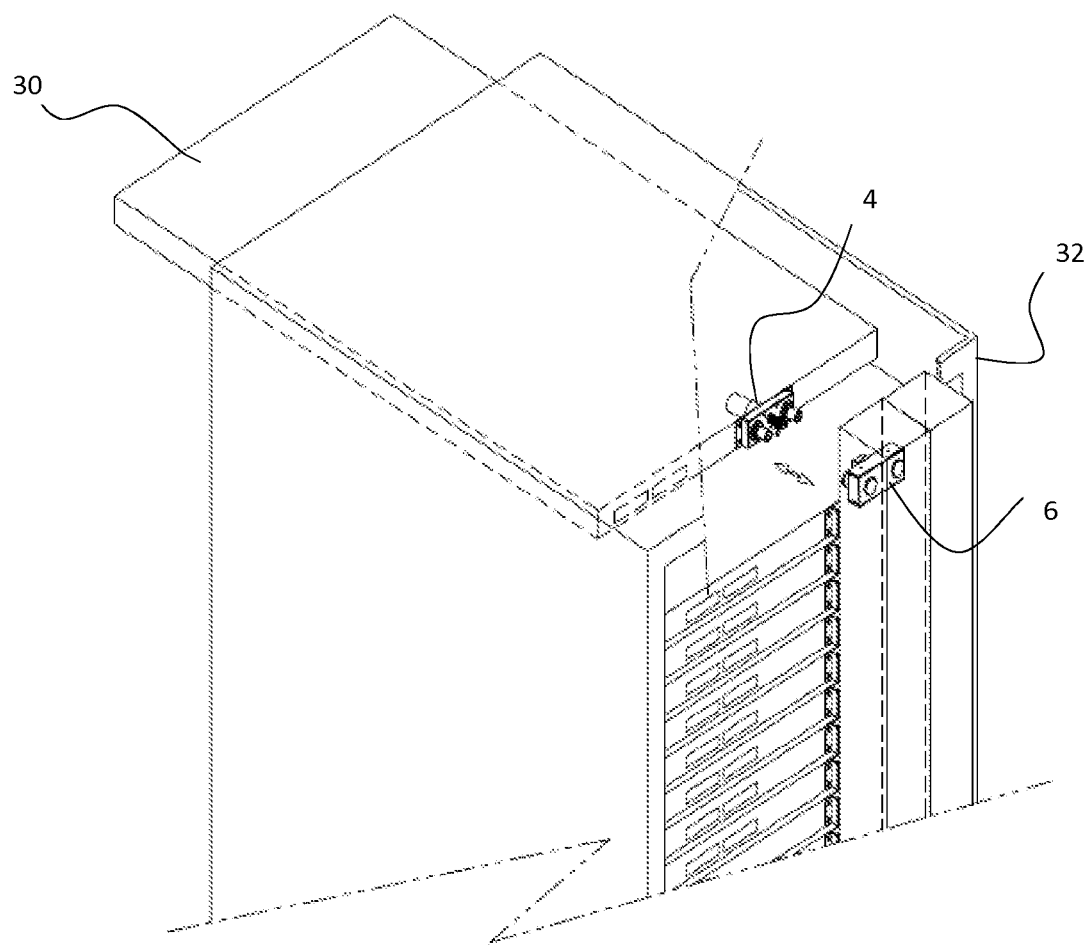
FIG. 4 partial perspective view of the automatic engagement system of FIG. 1, mounted within a chassis of an equipment module (e.g., server) and cabinet, with the male section mounted to the chassis and the female section mounted on the cabinet.

As will be appreciate by those skilled in the art after reviewing this disclosure, the automatic engagement system 2 of the present disclosure can be employed in a variety of context. FIG. 4 shows one of those context, namely, wherein the male section is coupled to a chassis of a server 30 or other equipment module, and the female section 6 is couple to a cabinet or rack 32. As will be appreciated by those skilled in the art after reviewing the present disclosure, a user can accomplish blind mating of connectors 8, 14 on the respective sections, using the automatic engagement system 2 of the present disclosure. That is, for example, by manually inserting the server chassis 30 into the cabinet 32 until the male section 4 and female section 6, engage to automatically power the motor, which shuts off when the sections are fully engaged and the connector sections 8, 14 are connected (e.g., such as fluid conduit couplings for allowing fluid to flow for cooling from a fluid source to the connectors 8, 14). The user can depress the actuator button 26 when it is desired to disengage the chassis from the rack or cabinet, in the manner described above.

Figure 6:
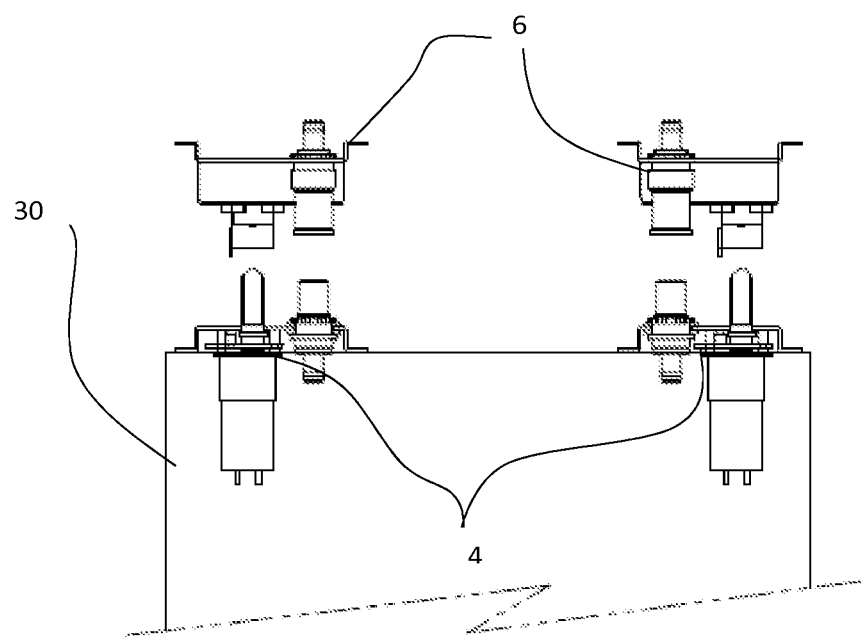
FIG. 6 is a simplified overhead plan view of another embodiment of an automatic engagement system of the present disclosure, having two female sections and two male sections.

Referring to FIG. 6, in some embodiments, more than one pair of corresponding female/male sections 4, 6 can be provided on a chassis and a rack or cabinet, to operate together. For example, each of the sections 4, 6 can have one or more first or second connector sections, and could have one or more connector shafts 12, corresponding motors, and one or more receiving ports 16, as will be appreciated by those skilled in the art after reviewing this disclosure.

Figure 7:
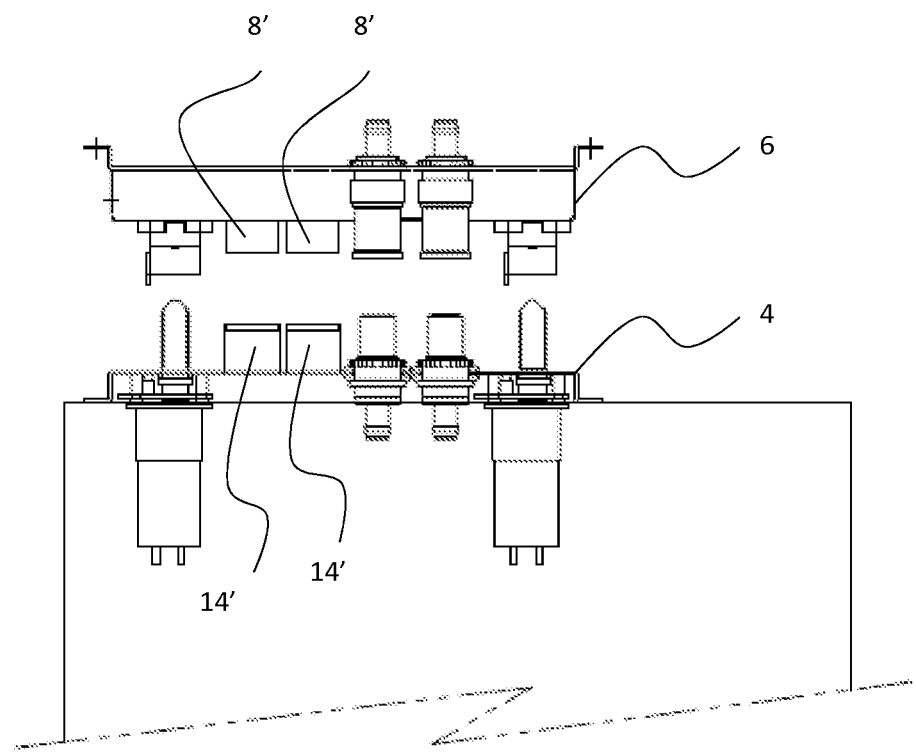
FIG. 7 is a simplified overhead plan view of another embodiment of an automatic engagement system of the present disclosure, having both fluid conduit and electrical couplings.

Referring to FIG. 7, in some embodiments, either electrical connector sections (8', 14'), or fluid connector sections (8, 14), or both, can be included on one female section and one corresponding male section 4, 6. In addition, one or more connector shafts 12, corresponding motors and receiving ports 16, can also be provided on one female section 6 and one corresponding male section 4, to help automatically engage the connector sections 8', 14', 8, 14, such as, for example, to accommodate larger or wider chassis with a plurality of connectors spread out over a width of the chassis.

In some embodiments of the present disclosure, when power is disengaged from the automatic engagement system 2, a user can manually disconnect the connector shaft 12 from the receiving port 16. For example, referring to FIG. 3, in some embodiments, a safety button 24' can be depressed, to unlock a latch 22, which can be depressed downward, to disengage one or more threaded mating members within the receiving port from the connector shaft, such as by, for example, pulling them away from the surface of the connector shaft 12 (not illustrated). That is, for example, the latch 22 can be disposed on one side of the connector shaft 12 in the receiving port 16; however, the internal mating threads 22'—which are positioned in the receiving port to contact the connector shaft 22—can be connected to the latch 22, so that when the latch 22 is depressed, so are the mating threads 22'. Thereafter, the connector shaft 12 can be removed from the receiving port without rotation. When the latch 22 is not depressed, a spring 24 can bias it in an upward direction, relative to the FIG. 3, which in turn, can maintain mating threads 22' inside the receiving port in a position to mate with the external threads of the connector shaft 12, as will be appreciated by those skilled in the art after reviewing this disclosure.

Although specific embodiments and examples of the disclosure have been described supra for illustrative purposes, various equivalent modifications can be made without departing from the spirit and scope of the disclosure, as will be recognized by those skilled in the relevant art after reviewing the present disclosure. The various embodiments described can be combined to provide further embodiments. The described devices and methods can omit some elements or acts, can add other elements or acts, or can combine the elements or execute the acts in a different order than that illustrated, to achieve various advantages of the disclosure. These and other changes can be made to the disclosure in light of the above detailed description.

In general, in the following claims, the terms used should not be construed to limit the claimed invention(s) to the specific embodiments disclosed in the specification. Accordingly, the scope of invention(s) is determined entirely by the following claims.

What is claimed is:

1. An automatic engagement system for connecting fluid connector sections or power connector sections comprising:
    a male section having a motor and connector shaft, the motor being configured to rotate the connector shaft;
    a female section having a receiving port for receiving the connector shaft, the receiving port having one or more mating members for engaging a surface of the connector shaft, such that when the connector shaft rotates, the connector shaft is drawn into the receiving port, or drawn out of the receiving port, relative to the direction of rotation;
    at least one first fluid connector section or at least one first power connector section coupled to the male section;
    at least one second fluid connector section or at least one second power connector section coupled to the female section and alignable with the at least one first fluid connector section or the at least one first power connector section;
    a guide pin attached to either the female section or male section;
    a socket for receiving the guide pin, the socket being positioned on the female or male section opposite the female or male section on which the guide pin is attached;
    wherein the guide pin and socket are configured to complete a power circuit via metallic contact between the guide pin and socket to automatically activate the motor when the socket receives the guide pin, which in turn, rotates the connector shaft to draw the connector shaft into the receiving port, and whereby the at least one first fluid connector section or the at least one first power connector section is automatically engaged with the at least one second fluid connector section or the at least one second power connector section; and
    a manually operated disengagement actuator member disposed remote from the guide pin and socket, the actuator member being electrically connected to the motor and configured to cause the connector shaft to rotate in a reverse direction to withdraw the connector shaft from the receiving port when the actuator member is depressed.

2. The automatic engagement system of claim 1 wherein the manually operated disengagement actuator member is connected to an outwardly facing side of an equipment module, and at least one of the male section or female section is attached to an inwardly facing side of the equipment module.

3. The automatic engagement system of claim 2 further comprising a light that is illuminated automatically when the female section and male section are connected, and is automatically switched off when the female section is disconnected from the male section.

\* \* \* \* \*